(12) United States Patent
Butler et al.

(10) Patent No.: US 10,209,634 B2
(45) Date of Patent: Feb. 19, 2019

(54) LITHOGRAPHIC APPARATUS AND DEVICE MANUFACTURING METHOD

(71) Applicant: ASML Netherlands B.V., Veldhoven (NL)

(72) Inventors: Hans Butler, Best (NL); Maurice Willem Jozef Etiënne Wijckmans, Eindhoven (NL); Engelbertus Antonius Fransiscus Van Der Pasch, Oirschot (NL); Christiaan Alexander Hoogendam, Westerhoven (NL); Bernardus Antonius Johannes Luttikhuis, Nuenen (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/547,713

(22) PCT Filed: Jan. 26, 2016

(86) PCT No.: PCT/EP2016/051524
§ 371 (c)(1),
(2) Date: Jul. 31, 2017

(87) PCT Pub. No.: WO2016/139012
PCT Pub. Date: Sep. 9, 2016

(65) Prior Publication Data
US 2018/0017879 A1 Jan. 18, 2018

(30) Foreign Application Priority Data

Mar. 3, 2015 (EP) .................................... 15157381
May 13, 2015 (EP) .................................... 15167646

(51) Int. Cl.
*G03F 7/20* (2006.01)

(52) U.S. Cl.
CPC .......... *G03F 7/70833* (2013.01); *G03F 7/709* (2013.01); *G03F 7/70725* (2013.01)

(58) Field of Classification Search
CPC ... G03F 7/70725; G03F 7/70833; G03F 7/709
(Continued)

(56) References Cited

U.S. PATENT DOCUMENTS

| 6,774,981 B1 * | 8/2004 | Watson | G03B 27/42 248/550 |
| 2003/0117596 A1 * | 6/2003 | Nishi | G03F 7/70766 355/72 |

(Continued)

FOREIGN PATENT DOCUMENTS

| CN | 102171617 | 8/2011 |
| CN | 102566308 | 7/2012 |

(Continued)

OTHER PUBLICATIONS

International Search Report and Written Opinion dated May 9, 2016 in corresponding International Patent Application No. PCT/EP2016/051524.

(Continued)

*Primary Examiner* — Colin Kreutzer
(74) *Attorney, Agent, or Firm* — Pillsbury Winthrop Shaw Pittman LLP

(57) ABSTRACT

A lithographic apparatus comprising: a positioning stage (WT); an isolation frame (300); a projection system (PS), comprising a first frame (210); a second frame (220); a supporting frame (10) for supporting the positioning stage; a first vibration isolation system (250) and a second vibration isolation system (270), wherein the supporting frame and the first frame are coupled via the first vibration isolation system; a stage position measurement system (400) to determine directly the position of a stage reference of an element of the positioning stage in one or more degrees of freedom with respect to an isolation frame reference of an element of the isolation frame; and wherein the first frame and the isolation frame are coupled via the second vibration isolation system.

20 Claims, 5 Drawing Sheets

(58) Field of Classification Search
USPC ....... 310/12.05, 12.06; 318/649; 355/53, 72, 355/77
See application file for complete search history.

(56) References Cited

U.S. PATENT DOCUMENTS

| | | |
|---|---|---|
| 2005/0063288 A1 | 3/2005 | Nawata et al. |
| 2011/0194091 A1 | 8/2011 | Kwan et al. |
| 2012/0154774 A1 | 6/2012 | Van Der Wijst et al. |
| 2014/0185029 A1 | 7/2014 | Kwan et al. |

FOREIGN PATENT DOCUMENTS

| | | |
|---|---|---|
| JP | 2002305140 | 10/2002 |
| JP | 2006250291 | 9/2006 |
| JP | 2010135796 | 6/2010 |
| JP | 2014099564 | 5/2014 |
| JP | 2014526792 | 10/2014 |
| TW | 201351056 | 12/2013 |

OTHER PUBLICATIONS

Chinese Office Action and Search Report issued in corresponding Chinese Application No. 201680013461.X, dated Apr. 26, 2018, with English translation, 16 pages.
Japanese Office Action issued in corresponding Japanese Patent Application No. 2017-546611, dated Sep. 25, 2018.

* cited by examiner

-- PRIOR ART --

LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2016/051524, which was filed on Jan. 26, 2016, which claims the benefit of priority of European patent applications 15157381.3 and 15167646.7, which were filed on 3 Mar. 2015 and 13 May 2015, respectively, and which are incorporated herein in their entireties by reference.

FIELD

The present invention relates to a lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs).

The desired pattern may be transferred onto the substrate by irradiating the substrate with a radiation beam from a projection system. The substrate is supported on and positioned relative to the projection system by a positioning stage. It is necessary correctly to align the substrate with the projection system in order that the desired pattern is applied at the correct location on the substrate. For this purpose the position in one or more degrees of freedom of the substrate relative to at least one optical element of the projection system is measured.

Movement of the positioning stage can lead to resonances in components used during measurement of the position of the substrate relative to the at least one optical element of the projection system. Such resonances result in stage positioning error which is an error in the position of the positioning stage due to an inaccurately measured position of the positioning stage relative to the at least one optical element of the projection system.

It is desirable to reduce stage positioning error.

SUMMARY

According to an aspect of the invention, there is provided a lithographic apparatus comprising: a positioning stage; an isolation frame; a projection system, comprising a first frame; a second frame; a supporting frame for supporting the positioning stage; a first vibration isolation system and a second vibration isolation system, wherein the supporting frame and the first frame are coupled via the first vibration isolation system; a stage position measurement system to determine directly the position of a stage reference of an element of the positioning stage in one or more degrees of freedom with respect to an isolation frame reference of an element of the isolation frame; and wherein the first frame and the isolation frame are coupled via the second vibration isolation system.

According to an aspect of the invention, there is provided a device manufacturing method comprising: providing a substrate on a positioning stage supported by a supporting frame; isolating vibrations between the supporting frame and a first frame of a projection system using a first vibration isolation system; isolating vibrations between the first frame and an isolation frame coupled to the first frame using a second vibration isolation system; determining directly the position of a stage reference of an element of the positioning stage in one or more degrees of freedom with respect to an isolation frame reference of an element of the isolation frame; passing a radiation beam through the projection system; and irradiating a surface of the substrate with the radiation beam from the projection system.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
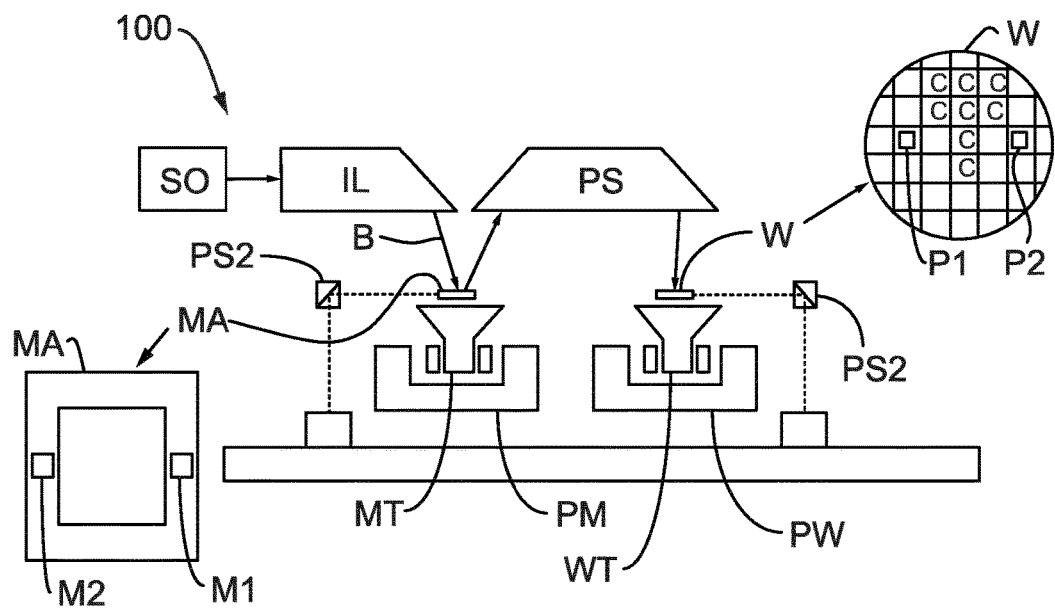
FIG. 1 depicts a lithographic apparatus according to an embodiment of the invention.

FIG. 1 schematically depicts a lithographic apparatus 100 according to an embodiment of the invention. The lithographic apparatus 100 includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device MA in accordance with certain parameters. The lithographic apparatus 100 also includes a positioning stage (e.g. a wafer table) WT constructed to hold a substrate (e.g. a resist coated wafer) W and connected to a second positioning device PW configured to accurately position the substrate W in accordance with certain parameters. The lithographic apparatus 100 further includes a projection system (e.g. a reflective projection lens system) PS configured to project a pattern imparted to the radiation beam B by patterning device MA onto a target portion C (e.g. including one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The mask support structure MT supports, i.e. bears the weight of, the patterning device MA. The mask support structure MT holds the patterning device MA in a manner that depends on the orientation of the patterning device MA, the design of the lithographic apparatus 100, and other conditions, such as for example whether or not the patterning device MA is held in a vacuum environment. The mask support structure MT can use mechanical, vacuum, electrostatic or other clamping techniques to hold the patterning device. The mask support structure MT may be a frame or a table, for example, which may be fixed or movable as required. The mask support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart the radiation beam B with a pattern in its cross-section so as to create a pattern in a target portion C of the substrate W. It should be noted that the pattern imparted to the radiation beam B may not exactly correspond to the desired pattern in the target portion C of the substrate W, for example if the pattern includes phase-shifting features or so called assist features. Generally, the pattern imparted to the radiation beam B will correspond to a particular functional layer in a device being created in the target portion C, such as an integrated circuit.

The patterning device MA is illustrated as being reflective, but may be transmissive. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system PS, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The illumination system IL may include an adjuster configured to adjust the angular intensity distribution of the radiation beam. Generally, at least the outer and/or inner radial extent (commonly referred to as σ-outer and σ-inner, respectively) of the intensity distribution in a pupil plane of the illumination system IL can be adjusted. In addition, the illumination system IL may include various other components, such as an integrator and a condenser. The illumination system IL may be used to condition the radiation beam B, to have a desired uniformity and intensity distribution in its cross section. The illumination system IL may or may not be considered to form part of the lithographic apparatus 100. For example, the illumination system IL may be an integral part of the lithographic apparatus 100 or may be a separate entity from the lithographic apparatus 100. In the latter case, the lithographic apparatus 100 may be configured to allow the illumination system IL to be mounted thereon. Optionally, the illumination system IL is detachable and may be separately provided (for example, by the lithographic apparatus manufacturer or another supplier).

As here depicted, the lithographic apparatus 100 is of a reflective type (e.g. employing a programmable mirror array of a type as referred to above, or employing a reflective mask). Alternatively, the lithographic apparatus 100 may be of a transmissive type (e.g. employing a transmissive mask).

The lithographic apparatus 100 may be of a type having two (dual stage) or more positioning stages WT (and/or two or more mask support structures MT, e.g. mask tables). In such a "multiple stage" lithographic apparatus 100 the additional positioning stages WT and/or mask support structures MT may be used in parallel, or preparatory steps may be carried out on one or more positioning stages WT and/or mask support structures MT while one or more other positioning stages WT and/or mask support structures MT are being used for exposure.

The patterning device MA is held on the mask support structure MT. The radiation beam B is incident on the patterning device MA. The radiation beam B is patterned by the patterning device MA. After being reflected from the patterning device MA, the radiation beam B passes through the projection system PS. The projection system PS focuses the radiation beam B onto a target portion C of the substrate W. The first positioner PM and a first position sensor (e.g., an interferometric device, linear encoder or capacitive sensor) PS1 can be used to accurately position the patterning device MA with respect to the path of the radiation beam B. With the aid of the second positioner PW and a second position sensor PS2 (e.g., an interferometric device, linear encoder or capacitive sensor), the substrate table WT can be moved accurately, e.g., so as to position different target portions C in the path of the radiation beam B.

In general, movement of the mask support structure MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioner PW. In the case of a stepper (as opposed to a scanner) the mask support structure MT may be connected to a short-stroke actuator only, or may be fixed. The patterning device MA may be aligned using mask alignment marks $M_1$, $M_2$. The substrate W may be aligned using substrate alignment marks $P_1$, $P_2$. Although the substrate alignment marks $P_1$, $P_2$ as illustrated occupy dedicated target portions C, they may be located between target portions C (these are known as scribe-lane alignment marks). Similarly, in situations in which more than one die is provided on the patterning device MA, the mask alignment marks $M_1$, $M_2$ may be located between the dies.

Immersion techniques can be used to increase the numerical aperture NA of the projection system PS. In an embodiment the lithographic apparatus 100 is of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus 100, for example, between the patterning device MA and the projection system PS. The term "immersion" as used herein does not mean that a structure, such as the substrate W, must be submerged in liquid, but rather only means that a liquid is located between the projection system PS and the substrate W during exposure.

Referring to FIG. 1, the illuminator IL receives a radiation beam from a source module SO. The source module SO and the lithographic apparatus 100 may be separate entities, for example when the source module SO is an excimer laser. In such cases, the source module SO is not considered to form part of the lithographic apparatus 100 and radiation is passed from the source module SO to the illumination system IL with the aid of a beam delivery system. In an embodiment the beam delivery system includes, for example, suitable directing mirrors and/or a beam expander. In other cases the source module SO may be an integral part of the lithographic apparatus 100, for example when the source module SO is a mercury lamp. The source module SO and the illumination system IL, together with the beam delivery system if required, may be referred to as a radiation system.

Figure 2:
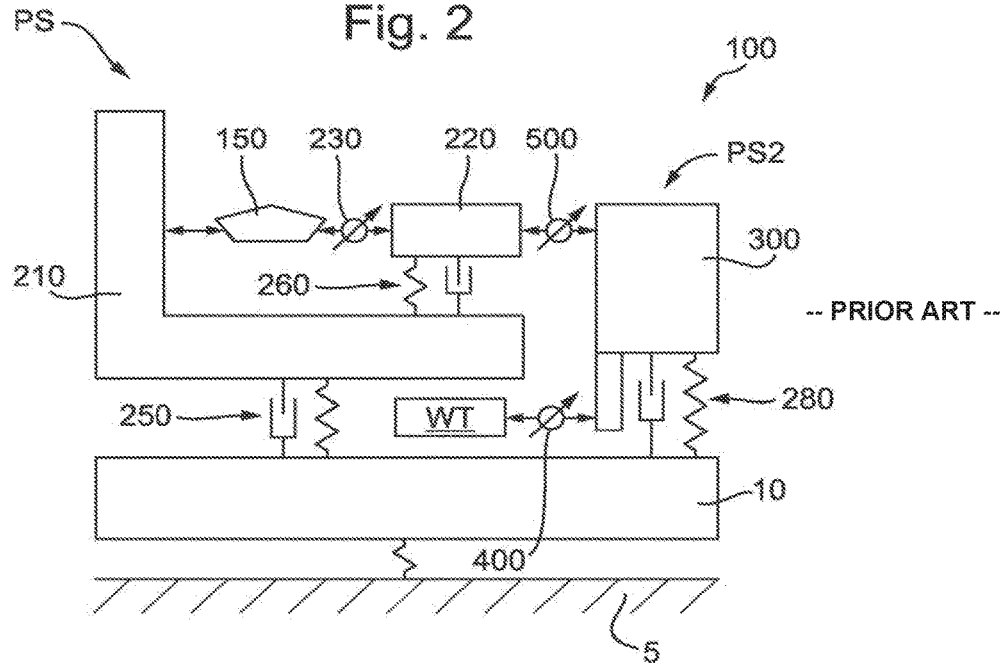
FIG. 2 is an illustration of a lithographic apparatus.

Reference will now be made to FIG. 2 which illustrates schematically a prior arrangement of a lithographic apparatus. A supporting frame 10 of the apparatus 100 is mounted to the floor 5 with as high stiffness as possible. The supporting frame 10 of the apparatus 100 supports the positioning stage WT. The substrate (not illustrated in FIG. 2) is supported on the positioning stage WT.

The projection system PS comprises a first frame 210 and a second frame 220. One or more optical elements 150 of the projection system PS are attached to the first frame 210. Sensors of a schematically illustrated optical element position measurement system 230 are used to measure the position of the optical elements 150 relative to the second frame 220.

The first frame 210 is a force frame meaning that it bears the reaction force when a force is applied to the at least one optical element 150 to move them and also bears the weight of the at least one optical element 150. The second frame 220 is a sensor frame meaning that it supports components used for measuring the position of the at least one optical element 150. The position of the at least one optical element 150 is measured in at least one degree of freedom relative to the second frame 220.

The functioning of the second position sensor PS2 will now be described. The position of the positioning stage WT is measured relative to an isolation frame 300 using a schematically illustrated stage position measurement system 400. The stage position measurement system 400 is used in the FIG. 2 machine for measuring the position of the positioning stage WT during illumination of the substrate W by the radiation beam B as well as during a measuring phase when certain features of the substrate W mounted on the positioning stage WT are measured. For example, the surface topography of the substrate is measured (sometimes called levelling) and the position of the substrate W on the positioning stage WT is measured.

The stage position measurement system 400 may be of any type. The stage position measurement system 400 determines directly the position of a stage reference of an element of the positioning stage WT in one or more degrees of freedom with respect to an isolation frame reference of an element of the isolation frame 300. The position measurement is direct in that it is the direct measurement between first and second elements of the positioning stage and isolation frame as opposed to measurement between the first and second elements via an object not part of to either the positioning stage WT or isolation frame 300. The stage reference and isolation reference are arbitrary positions relative to the element of the positioning stage WT and isolation frame 300 respectively. The stage reference remains stationary with respect to the element of the positioning stage WT. The isolation reference remains stationary with respect to the element of the isolation frame 300. In an embodiment the stage position measurement system 400 is a linear encoder system. In a linear encoder system an emitter and receiver are mounted on one of the positioning stage WT and isolation frame 300 and a reflective diffraction grid is mounted on the other of the positioning stage WT and isolation frame 300. Thus, the emitter/receiver are an element of the positioning stage WT or isolation frame 300 and the reflective diffraction grid is an element of the other of the positioning stage WT and isolation frame 300. A beam of radiation is emitted by the emitter towards the reflective diffraction grid and the reflected/diffracted radiation is detected by the receiver. On the basis of the detected reflected/diffracted radiation the position of the emitter/receiver relative to the reflective diffraction grid can be determined. Thus, the stage position measurement system 400 can determine directly the position of the stage reference of an element of the positioning stage WT in one or more degrees of freedom with respect to the isolation frame reference of an element of the isolation frame 300. The reflective diffraction grid may be stiffly mounted to the isolation frame 300 or positioning stage WT or may be mounted via a grid vibration isolation system. In the latter case a sensor may be necessary to determine the position of the reflective diffraction grid relative to the positioning stage WT or isolation frame 300 to which the reflective diffraction grid is mounted before the position of the stage reference relative to the isolation reference may be determined. A linear encoder system may be used in combination with or alternatively to an interferometric device for determining the positioning stage WT relative to the isolation frame 300.

An isolation frame position measurement system 500 (illustrated schematically) is used for measuring the relative position of the isolation frame 300 in one or more degrees of freedom to the second frame 220 of the projection system PS. The isolation frame position measurement system 500 may be an interferometric device.

The relative position of the substrate W on the positioning stage WT relative to the at least one optical element 150 can be calculated by knowing the position of the substrate W relative to the stage reference of the positioning stage WT and from the results of the optical element position measurement system 230, the stage position measurement system 400 and the isolation frame position measurement system 500.

The first frame 210 is supported on the supporting frame 10. The first frame 210 is supported on the supporting frame 10 via a first vibration isolation system 250 (illustrated schematically). The first vibration isolation system 250 resonance of the first frame 210 relative to the supporting frame 10 occurs at a first low-frequency eigen frequency. The first vibration isolation system 250 may be an air mount. Due to the first vibration isolation system 250, vibration isolation starts at a low frequency (e.g. below 10 Hz or below 5 Hz or below 2 Hz or below 1 Hz or below 0.5 Hz) so that the first frame 210 is isolated from higher frequencies of the supporting frame 10.

The second frame 220 is coupled to the first frame 210. In an embodiment the second frame 220 is supported by the first frame 210. The second frame 220 is coupled to the first frame 210 directly via a second frame vibration isolation system 260 (schematically illustrated). The second frame vibration isolation system 260 may be a magnetic gravity compensator. Due to the second frame vibration isolation system 260 resonance of the second frame 220 relative to the first frame 210 occurs at a second low-eigen frequency (e.g. below 10 Hz or below 5 Hz). The first low-frequency eigen frequency is different to the second low-frequency eigen frequency. In an embodiment the first low-frequency eigen frequency is lower than the second low-frequency eigen frequency.

In the apparatus of FIG. 2, the isolation frame 300 is supported directly by the supporting frame 10. The isolation frame 300 is connected to the supporting frame 10 via an isolation frame vibration isolation system 280. The isolation frame vibration isolation system 280 between the isolation frame 300 and the supporting frame 10 may be the same or similar to that of the first vibration isolation system 250.

The vibration isolation systems 250, 260, 280 of FIG. 2 are illustrated as a functionally equivalent to a spring and a damper in parallel. However, any type of vibration isolation system may be used including those types employing active damping. A vibration isolation system is different to a vibration reduction system in that a vibration isolation system filters out frequencies above the eigen frequency of the isolation system so that there is vibration isolation at higher frequencies. A vibration reduction system attenuates vibrations and typically is effective at higher frequencies than a vibration isolation system.

Although not illustrated in FIG. 2, the illuminator IL may be coupled to the first frame 210. This may be advantageous as the position of the illuminator IL will thereby be closer to the at least one optical element 150. In an alternative embodiment the illuminator IL may be suspended from the supporting frame 10 with a separate vibration isolator to that of the first frame 210.

The supporting frame 10, first frame 210, second frame 220, isolation frame 300 and other frames described herein may each be integrally formed frames. Alternatively each of those frames may be a composite frame comprising two or more elements fixed together stiffly. The term frame encompasses any number of elements fixed together in a stiff way, for example by being bolted together or by being glued together. When two frames are described as being mounted to each other in a stiff way those two frames may be integrally formed of a single component or may be formed of two or more components fixed together in a stiff way.

Figure 3:
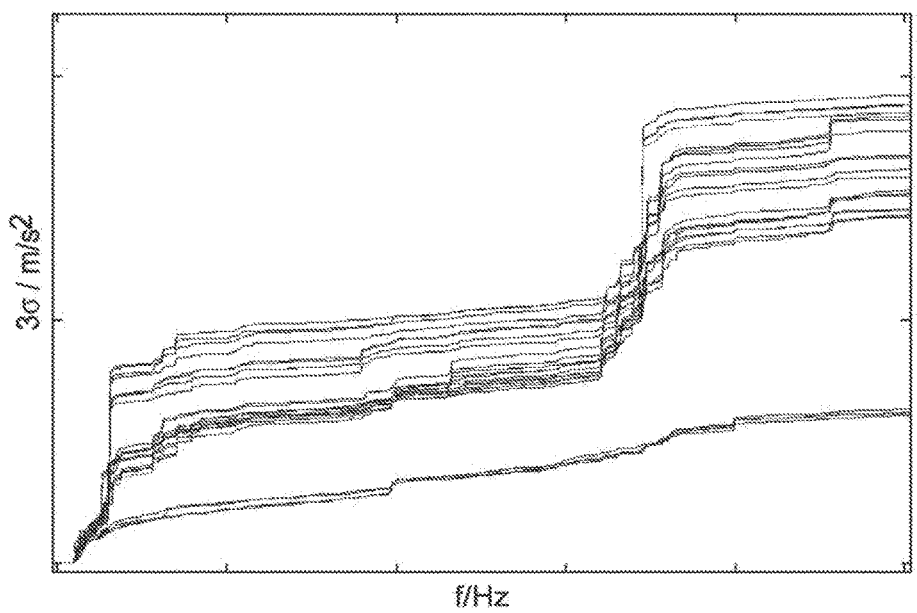
FIG. 3 is a cumulative power spectral density showing the performance of the isolation frame of FIG. 2.

FIG. 3 is a cumulative power spectral density graph with increasing frequency along the X axis and 3σ acceleration of the isolation frame 300 along the Y axis for the machine of FIG. 2. The bottom line shows the situation when the positioning stage WT is at standstill and the upper lines illustrate the cumulative accelerations present during a selection of different scanning movements of the positioning stage WT. As can be seen, at certain frequencies resonance of the isolation frame 300 occurs.

Figure 4:
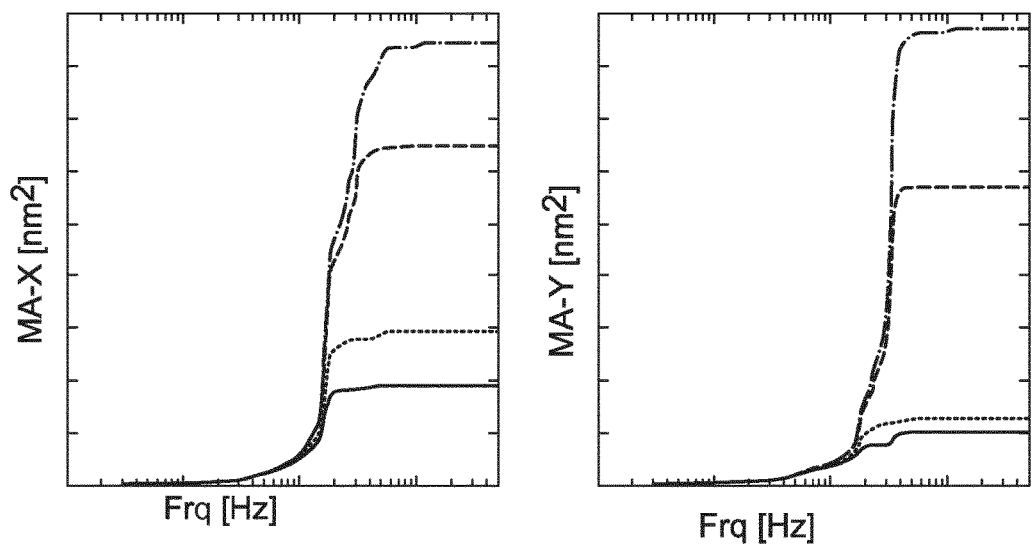
FIG. 4 is a graph showing cumulative error vs. frequency for the positioning stage of FIG. 2.

FIG. 3 shows that resonances of the isolation frame 300 are formed to a large extent by scanning movement of the positioning stage WT and thereby form a large part of any positioning stage WT position error. FIG. 4 depicts graphs of frequency vs. cumulative position error of positioning stage WT. The frequencies at which position error increases dramatically correspond to the resonant frequencies seen in FIG. 3.

For future machines, accelerations of the positioning stage WT will increase. The increase in acceleration will increase by an order of magnitude the excitation level of the supporting frame 10. A part of this increased excitation of the supporting frame 10 will be transported to the isolation frame 300 via the isolation frame vibration isolation system 280. This will result in an increase in errors in the measurement of the position of the positioning stage WT relative to the second frame 220 (i.e. increased stage positioning error). In addition, the increased speed of scanning during imaging and the reduction in size of the slit for new machines will make alignment of the mask MA to the substrate W positioned on the positioning stage WT more difficult.

An embodiment of the invention reduces resonances of the isolation frame 300 resulting from positioning stage WT scanning movements thereby reducing the error in the position measurement of the positioning stage WT with respect to the at least one optical element.

In an embodiment the isolation frame 300 is coupled via a second vibration isolation system 270 to the first frame 210 instead of being coupled to the supporting frame 10 as in FIG. 2. In an embodiment the isolation frame 300 is supported by the first frame 220. For example, the isolation frame 300 is directly coupled via the second vibration isolation system 270 to the first frame 220. Therefore there are two vibration isolation systems (250 and 270) in series between the supporting frame 10 and the isolation frame 300. The first vibration isolation system 250 is between the supporting frame 10 and the first frame 220 just like in the FIG. 2 apparatus. The second vibration isolation system 270 is between the first frame 210 and the isolation frame 300. Thus the isolation frame 300 has double isolation from movement of the supporting frame 10 (induced by movement of the positioning stage WT).

In an embodiment, the isolation frame 300 may have triple isolation or more from movement of the supporting frame 10. This could be achieved, for example, by providing a further frame between the first frame 210 and the isolation frame 300, with the second vibration isolation system 270 between the further frame and the isolation frame 300 and a further (third) vibration isolation system between the further frame and the first frame 210. More than double isolation will reduce stage positioning error further, at the expense of increased complexity.

Figure 5:
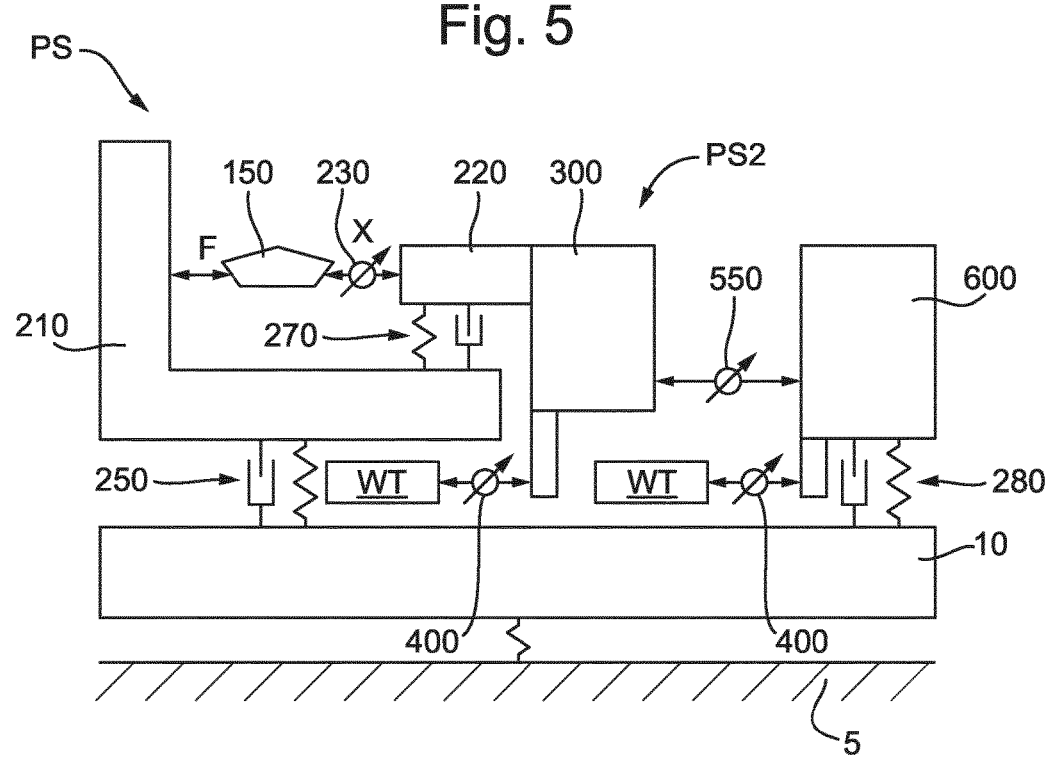
FIG. 5 is a schematic illustration of a first embodiment of a lithographic apparatus.

FIG. 5 illustrates a first embodiment. The embodiment of FIG. 5 is the same as the machine of FIG. 2 except as described below. In the FIG. 5 embodiment the isolation frame 300 is used by the stage position measurement system 400 for measuring the position of the positioning stage WT relative to the at least one optical element 150 during exposure of the substrate W by the projection beam B. A further isolation frame 600 is provided for measuring the position of the positioning stage WT during the measurement phase. The further isolation frame 600 is arranged in the same or a similar way to the isolation frame 300 of FIG. 2 (e.g. it is supported on the supporting frame 10 via the isolation frame vibration isolation system 280).

The isolation frame 300 of the FIG. 5 embodiment is mounted to the second frame 220. The isolation frame 300 is mounted stiffly to the second frame 220. The isolation frame 300 and second frame 220 may be integrally formed. The second frame 220 and isolation frame 300 are coupled directly to the first frame 210 via the second vibration isolation system 270. The second frame 200 and isolation frame 300 are supported by the first frame 210. The second vibration isolation system 270 may be the same or similar to the second frame vibration isolation system 260 of FIG. 2.

Because the relative position of the isolation frame 300 to the second frame 220 is fixed, no isolation frame position measurement system 500 is required. The position of the at least one optical element 150 relative to the second frame 220 is known from the optical element position measurement system 230. Thereby the relative position of the positioning stage WT to the at least one optical element 150 can be calculated.

Figure 6:
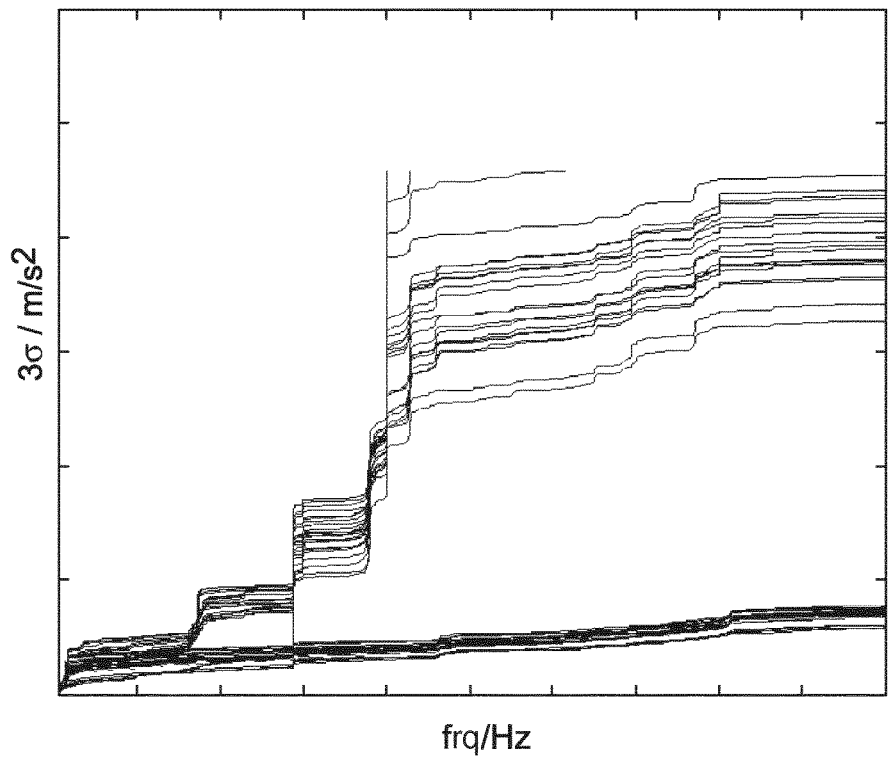
FIG. 6 is a cumulative power spectral density graph of the second frame of the FIG. 2 lithographic apparatus.

As a result of the first vibration isolation system 250 and second vibration isolation system 270 being in series between the supporting frame 10 and isolation frame 300, the resonances of the isolation frame 300 can be assumed to be reduced to the typical levels of resonances seen by the second frame 220 in the apparatus of FIG. 2. FIG. 6 shows a cumulative power spectral density graph similar to FIG. 3 but shows the resonances of the second frame 220 (at the bottom) compared to those of the isolation frame 300 (at the top) for the machine of FIG. 2 during a variety of different scanning movements of the positioning stage WT. The amplitude of resonances of the second frame 220 are much lower than those of the isolation frame 300. The resonant performance of the isolation frame 300 of the FIG. 5 embodiment can be expected to be comparable to that of the second frame 220 of FIG. 2 as illustrated in FIG. 6. Thus the stage positioning error in the FIG. 5 machine is improved compared to the machine of FIG. 2.

In an embodiment the first frame 210, the isolation frame 300, the first vibration isolation system 250 and the second vibration isolation system 270 form a dynamical system having a first resonance mode at a first eigen frequency and second resonance mode at a second eigen frequency. In the first resonance mode the first frame 210 resonates relative to the supporting frame 10. In the second resonance mode the isolation frame 300 resonates relative to the first frame 210. The first eigen frequency is different (e.g. lower) to the second eigen frequency. For example, first eigen frequency is between 0.3-0.8 Hz, and the second eigen frequency is between 1-5 Hz. Active damping control of the first vibration isolation system 250 and second vibration isolation system 270 becomes more simple as a result and this is therefore advantageous.

As is illustrated in FIG. 5, the isolation frame 300 is used to measure the position of the positioning stage WT during imaging of the substrate W mounted on the positioning stage WT. The further isolation frame 600 is used for measuring the positioning of the positioning stage during a measurement phase. The relative position between the isolation frame 300 and the further isolation frame 600 is measured using a further isolation frame position measurement system 550 so that when the positioning stage WT moves from the measurement position to the imaging position hand over between the two stage position measurement systems 400 is possible.

Figure 7:
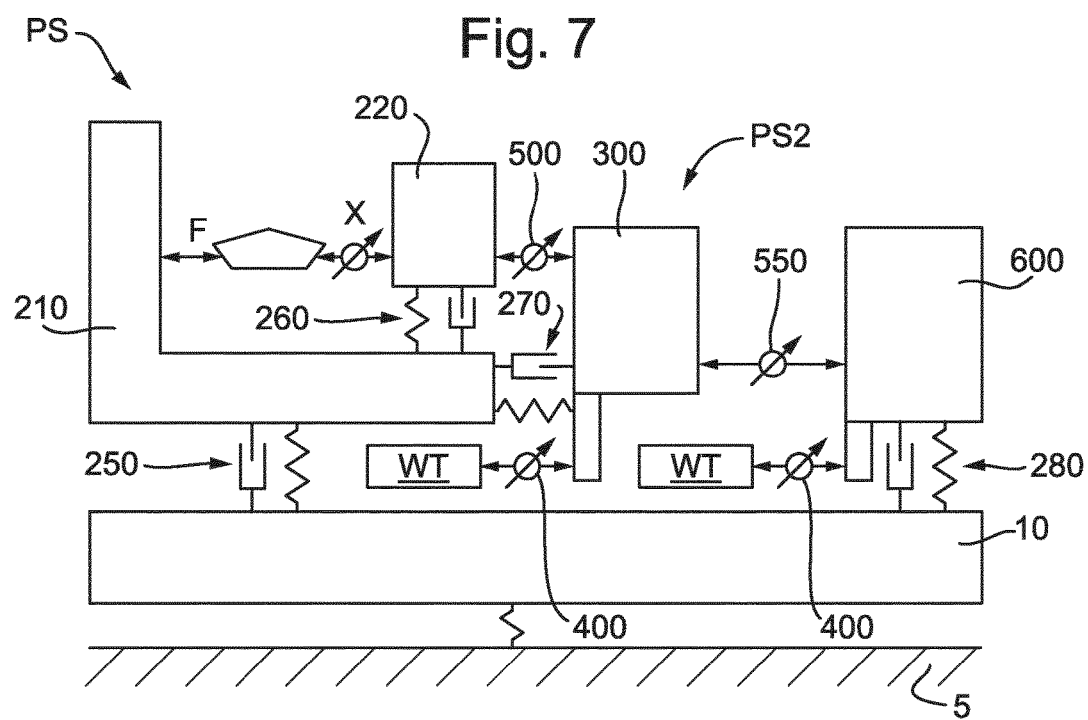
FIG. 7 is a schematic illustration of a second embodiment of a lithographic apparatus.

FIG. 7 shows a second embodiment which is the same of the first embodiment of FIG. 5 except as described below. In the embodiment of FIG. 7, the second frame 220 and isolation frame 300 are not coupled directly together. Instead the isolation frame 300 and second frame 220 are each coupled directly to the first frame 210 individually. The isolation frame 300 is coupled directly to and supported by the first frame 210 via the second vibration isolation system 270. The second frame 220 is coupled to the first frame 210 via the second frame vibration isolation system 260 like in the FIG. 2 machine. The second vibration isolation system 270 and second frame vibration isolation system 260 may be the same or similar.

Like in the machine of FIG. 2, because the second frame 220 and isolation frame 300 are not connected stiffly together, an isolation frame position measurement system 500 is used for measuring the relative position of the isolation frame 300 to the second frame 220 (like in the FIG. 2 machine).

The embodiment of FIG. 7 has the same advantages as the embodiment of FIG. 5 deriving from the two vibration isolation systems 250, 270 between the supporting frame 10 and the isolation frame 300.

In all embodiments the vibration isolation systems 250, 260, 270 and 280 may be used for position control of the frames. For example, second vibration isolation system 270 can be used in the embodiment of FIG. 7 to maintain within a predetermined range the relative position of the isolation frame 300 to the second frame 220. Thus, the position of one frame can be made approximately to track the position of another separate frame.

Figure 8:
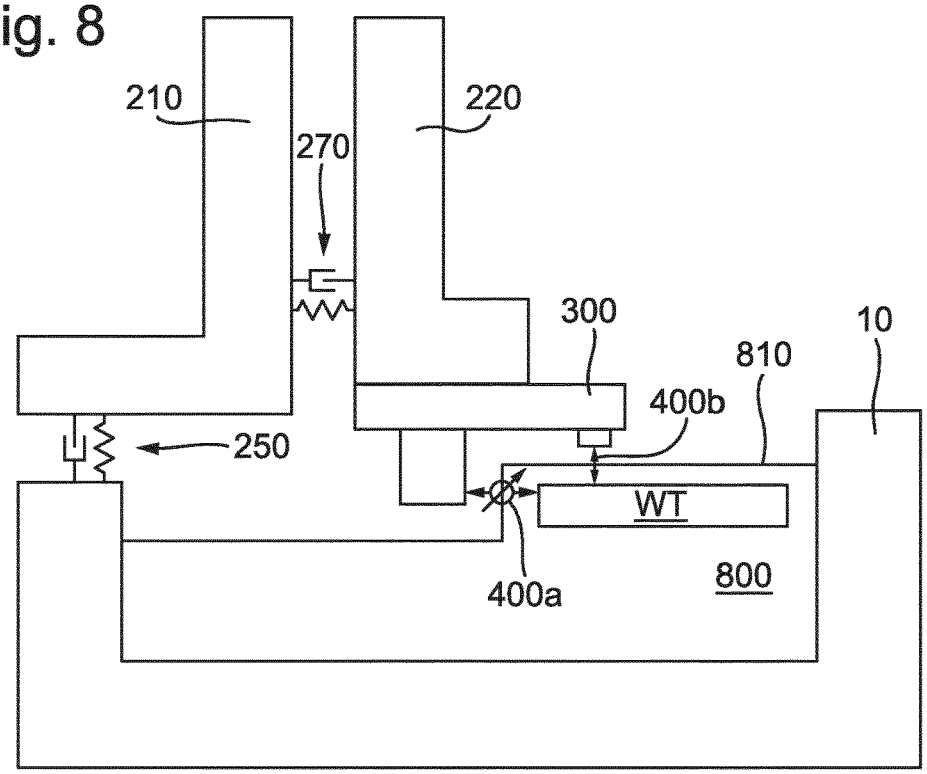
FIG. 8 illustrates schematically how the system of FIG. 5 might be implemented.
Figure 9:
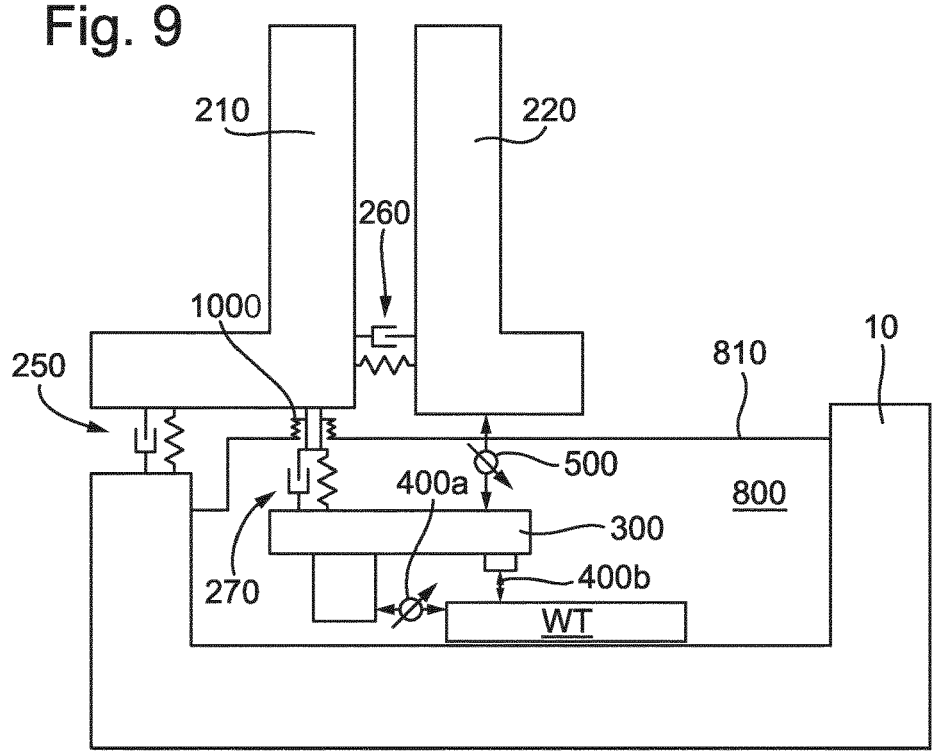
FIG. 9 illustrates schematically how the system of FIG. 7 might be implemented.

FIGS. 8 and 9 illustrate how the systems of FIGS. 5 and 7 might be implemented in an EUV apparatus. In an EUV apparatus the projection system PS is maintained in a very clean vacuum. Because a substrate W may out-gas, the positioning stage WT is held in a separate positioning stage vacuum chamber 800. A very small opening in a wall 810 of the positioning stage vacuum chamber 800 is provided so that the radiation beam B from the projection system PS may pass through it onto the substrate W. A flow of gas is provided through that opening from the very clean vacuum chamber of the projection system into the positioning stage vacuum chamber 800 such that no contamination resulting from the out-gassing of the substrate W can find its way into very clean vacuum of the projection system vacuum chamber.

In the FIG. 8 embodiment the isolation frame 300 is mounted to the second frame 220 like in the embodiment of FIG. 5. Interferometric devices and/or linear encoder devices 400a, 400b are used by the stage position measurement system 400 to determine directly the position of a stage reference of an element of the positioning stage WT in one or more degrees of freedom with respect to an isolation frame reference of an element of the isolation frame 300. Multiple sealed windows are provided to allow the beams of radiation to pass through the wall 810 of the positioning stage vacuum chamber 800.

In an alternative embodiment as illustrated in FIG. 9, the isolation frame 300 is positioned within the positioning stage vacuum chamber 800 and is coupled to the first frame 210 via the second vibration isolation system 270 like in the embodiment of FIG. 7. In this embodiment a bellow 1000 is provided in the wall 810 between the second vibration isolation system 270 and the first frame 210. Only a single measurement window in the wall 810 is required for the isolation frame position measurement system 500 which measures the relative position of the second frame 220 and the isolation frame 300.

In an embodiment of the invention a suitable tuned mass damper is connected to isolation frame 300 and/or 600 to reduce the amplitude of at least one of the resonances of the isolation frame. This is beneficial for the positioning stage performance as the isolation frame becomes less sensitive for e.g. disturbances forces induced by the movement of the positioning stage WT and flow induced vibrations. Alternatively or in addition a robust mass damper may be used, i.e. a mass damper not tuned for a specific frequency but a damper with an over-critical damping value resulting in a robust damper mechanism which is less sensitive for parameter variations in terms of stiffness and damping having a modal damping increase over a broad band of resonant frequencies.

In an alternative apparatus (not illustrated) which is otherwise the same as the FIG. 7 embodiment, the isolation frame 300 is mounted to a further force frame which is a different force frame to the first frame 210. The further force frame is isolated from the supporting frame 10 in the same way as the first frame 210 is isolated from the supporting frame 10 by first vibration isolation system 250. The isolation frame 300 is then mounted to the further force frame in the same way as it is mounted to the first frame 210 in the FIG. 7 embodiment. In this way two vibration isolators in series are between the supporting frame 10 and the isolation frame 300 so that the performance explained above with respect to FIG. 6 can be expected.

In order to shorten the exposure wavelength and, thus, reduce the minimum printable size, it has been proposed to use an extreme ultraviolet (EUV) source of radiation. EUV radiation is electromagnetic radiation having a wavelength within the range of 10-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

In an embodiment, there is provided a lithographic apparatus comprising: a positioning stage; a supporting frame for supporting the positioning stage; an isolation frame; a projection system, comprising a force frame and a sensor frame; and a first vibration isolation system and a second vibration isolation system, wherein the force frame and the supporting frame are coupled via the first vibration isolation system and the force frame and the isolation frame are coupled via the second vibration isolation system.

In an embodiment, the lithographic apparatus comprises a stage position measurement system to determine the position of a stage reference of an element of the positioning stage in one or more degrees of freedom with respect to an isolation frame reference of an element of the isolation frame. In an embodiment, the projection system further comprises a plurality of optical elements, the optical elements being attached to the force frame; and an optical element position measurement system for determining the position of the optical elements with respect to the sensor frame. In an embodiment, the sensor frame is mounted to the isolation frame. In an embodiment, the sensor frame is mounted to the force frame via a third vibration isolation system. In an embodiment, the lithographic apparatus comprises an isolation frame position measurement system to determine the position of the isolation frame in one or more degrees of freedom with respect to the sensor frame. In an embodiment, the force frame, the isolation frame, the first vibration isolation system and the second vibration isolation system form a dynamical system having a first resonance mode at a first eigen frequency and a second resonance mode at a second eigen frequency, wherein in the first resonance mode the force frame resonates relative to the supporting frame, wherein in the second resonance mode the isolation frame resonates relative to the force frame, and wherein the first eigen frequency is different from the second eigen frequency. In an embodiment, the lithographic apparatus further comprises a further isolation frame coupled via a further vibration isolation system to the supporting frame; and a further stage position measurement system directly to determine the position of the stage reference mounted on the positioning stage in one or more degrees of freedom with respect to a further isolation frame reference mounted on the further isolation frame. In an embodiment, the lithographic apparatus further comprises an illuminator that is coupled to the force frame.

In an embodiment, there is provided a device manufacturing method comprising: providing a substrate on a positioning stage supported by a supporting frame; isolating vibrations between the supporting frame and a force frame of a projection system using a first vibration isolation system; isolating vibrations between the force frame and an isolation frame coupled to the force frame using a second vibration isolation system; determining directly the position of a stage reference of an element of the positioning stage in one or more degrees of freedom with respect to an isolation frame reference of an element of the isolation frame; passing a radiation beam through the projection system; and irradiating a surface of the substrate with the radiation beam from the projection system.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:
1. A lithographic apparatus comprising:
a positioning stage;
a supporting frame configured to support the positioning stage;
an isolation frame configured for use in measurement of a position of he positioning stage;
a projection system, comprising:
a force frame that does not support the weight of the positioning stage and supports the weight of at least one optical element of the projection system, and
a sensor frame;
a first vibration isolation system and a second vibration isolation system, wherein:
the force frame and the supporting frame are coupled via the first vibration isolation system; and
the isolation frame is supported by, and coupled via the second vibration isolation system to, the force frame.
2. The lithographic apparatus of claim 1, comprising a stage position measurement system to determine the position of a stage reference of an element of the positioning stage in one or more degrees of freedom with respect to an isolation frame reference of an element of the isolation frame.
3. The lithographic apparatus of claim 1, wherein:
the projection system further comprises a plurality of optical elements, the optical elements being attached to the force frame; and an optical element position measurement system configured to determine the position of the optical elements with respect to the sensor frame.

4. The lithographic apparatus of claim 1, wherein the sensor frame is mounted to the isolation frame.

5. The lithographic apparatus of claim 1, wherein t e sensor frame is mounted to the force frame via a third vibration isolation system.

6. The lithographic apparatus of claim 5, further comprising an isolation frame position measurement system to determine the position of the isolation frame in one or more degrees of freedom with respect to the sensor frame.

7. The lithographic apparatus of claim 1, wherein the force frame, the isolation frame, the first vibration isolation system and the second vibration isolation system form a dynamical system having a first resonance mode at a first eigen frequency and a second resonance mode at a second eigen frequency,
- wherein, in the first resonance mode, the force frame resonates relative to the supporting frame,
- wherein, in the second resonance mode, the isolation frame resonates relative to the force frame, and
- wherein the first eigen frequency is different from the second eigen frequency.

8. The lithographic apparatus of claim 1, further comprising:
- a further isolation frame coupled via a further vibration isolation system to the supporting frame; and
- a further stage position measurement system configured to directly determine the position of a stage reference mounted on the positioning stage in one or more degrees of freedom with respect to a further isolation frame reference mounted on the further isolation frame.

9. The lithographic apparatus of claim 1, further comprising an illuminator that is coupled to the force frame.

10. A device manufacturing method comprising:
- providing a substrate on a positioning stage supported by a supporting frame;
- isolating vibrations between the supporting frame and a force frame of a projection system using a first vibration isolation system, the force frame supporting the weight of at least one optical element of the projection system and not supporting the weight of the positioning stage;
- isolating vibrations between the force frame and an isolation frame coupled to the force frame using a second vibration isolation system, the isolation frame configured for use in measurement of a position of the positioning stage;
- supporting the isolation frame by the force frame;
- passing a radiation beam through the projection system; and
- irradiating a surface of the substrate with the radiation beam from the projection system.

11. The method of claim 10, further comprising determining directly the position of a stage reference of an element of the positioning stage in one or more degrees of freedom with respect to an isolation frame reference of an element of the isolation frame using a stage position measurement system.

12. The method of claim 10, wherein the projection system further comprises a plurality of optical elements, the optical elements being attached to the force frame; and further comprising determining the position of the optical elements with respect to the sensor frame using an optical element position measurement system.

13. The method of claim 10, wherein a sensor frame of the projection system is mounted to the isolation frame.

14. The method of claim 10, further comprising isolating vibrations between the force frame and a sensor frame of the projection system using a third vibration isolation system.

15. The method of claim 14, further comprising determining the position of the isolation frame in one or more degrees of freedom with respect to the sensor frame using an isolation frame position measurement system.

16. The method of claim 10, wherein the force frame, the isolation frame, the first vibration isolation system and the second vibration isolation system form a dynamical system having a first resonance mode at a first eigen frequency and a second resonance mode at a second eigen frequency,
- wherein, in the first resonance mode, the force frame resonates relative to the supporting frame,
- wherein, in the second resonance mode, the isolation frame resonates relative to the force frame, and
- wherein the first eigen frequency is different from the second eigen frequency.

17. The method of claim 10, further comprising:
- isolating vibrations between the supporting frame and a further isolation frame using a further vibration isolation system; and
- directly determining the position of a stage reference mounted on the positioning stage in one or more degrees of freedom with respect to a further isolation frame reference mounted on the further isolation frame using a further stage position measurement system.

18. The method of claim 10, further comprising an illuminator of the lithographic apparatus that is coupled to the force frame.

19. A lithographic apparatus comprising:
- a positioning stage;
- a supporting frame configured to support the positioning stage;
- an isolation frame;
- a projection system, comprising:
  - a force frame, and
  - a sensor frame;
- a first vibration isolation system and a second vibration isolation system, wherein:
  - the force frame and the supporting frame are coupled via the first vibration isolation system, and
  - the force frame and the isolation frame are coupled via the second vibration isolation system;
- a further isolation frame coupled via a further vibration isolation system o the supporting frame; and
- a further stage position measurement system configured to directly determine the position of a stage reference mounted on the positioning stage in one or more degrees of freedom with respect to a further isolation frame reference mounted on the further isolation frame.

20. The lithographic apparatus of claim 19, wherein the sensor frame is mounted to the force frame via a third vibration isolation system.

* * * * *